United States Patent [19]

Shimada et al.

[11] Patent Number: 4,663,760
[45] Date of Patent: May 5, 1987

[54] SEMICONDUCTOR LASER OUTPUT CONTROL DEVICE

[75] Inventors: Kazuyuki Shimada, Tokyo; Isamu Shibata, Fuchu, both of Japan

[73] Assignee: Ricoh Company, Ltd., Tokyo, Japan

[21] Appl. No.: 821,069

[22] Filed: Jan. 21, 1986

[30] Foreign Application Priority Data

Jan. 30, 1985 [JP] Japan .................................. 60-16010

[51] Int. Cl.⁴ ............................................. H01S 3/13
[52] U.S. Cl. ...................................... 372/31; 372/38; 372/26
[58] Field of Search ........................ 372/29, 31, 26, 38

[56] References Cited

U.S. PATENT DOCUMENTS 4,516,242 5/1985 Yokota .................................. 372/29

Primary Examiner—Leon Scott, Jr.

Attorney, Agent, or Firm—Cooper, Dunham, Griffin & Moran

[57] ABSTRACT

A semiconductor laser output intensity control device is provided in a laser beam scanning system, such as a laser printer. A laser beam emitted from a semiconductor laser is modulated by image information and scanned across a photosensitive member for forming an image thereon. The present output intensity control device employs an up/down counter whose count determines the level of driving current to be applied to a laser driver which drives the semiconductor laser. The up/down counter changes its count either up or down depending on the magnitude of the output intensity of the laser beam as compared with a reference level. The present device includes a control circuit which prevents the power setting operation of the laser from taking place during a scanning time period in which the photosensitive member is scanned by the laser beam.

4 Claims, 4 Drawing Figures

SEMICONDUCTOR LASER OUTPUT CONTROL DEVICE

BACKGROUND OF THE INVENTION

1. Field of the Invention

This invention relates to stabilization of laser output intensity, and, in particular, to a device for controlling the output of a semiconductor laser using a counter.

2. Description of the Prior Art

In a laser printer, a semiconductor laser is often used as a light beam source, and a laser beam emitted from the semiconductor laser is modulated in accordance with image information. The thus modulated laser beam is then deflected by a rotating deflector repetitively so that the deflected laser beam carrying image information is scanned along a predetermined imaginary scanning line repetitively across the surface of a travelling photosensitive member so that there is formed an electrostatic latent image in accordance with the image information. However, since the intensity of the laser beam output from the semiconductor laser is very sensitive to the operating temperature, there must be provided a control device for controlling the intensity of the laser output beam if the surrounding temperature varies.

One approach to control the output intensity of a semiconductor laser uses a counter, in which case, driver current is supplied to the semiconductor laser according to the count of the counter. The counter is normally maintained disabled to hold the current count, and when no recording operation takes place, the counter is enabled and the number of clock pulses is counted such that the output intensity of the semiconductor laser is at a reference value, thereby carrying out the setting of the output intensity of the semiconductor laser. And, then, the counter is again disabled. On the other hand, the photosensitive member used as an imaging member for forming thereon an image tends to deteriorate if the laser beam output from the semiconductor laser impinges on the photosensitive member while it is motionless, e.g., in a stand-by mode.

SUMMARY OF THE INVENTION

It is therefore a primary object of the present invention to obviate the disadvantages of the prior art as described above and to provide an improved device for controlling the laser output of a semiconductor laser.

Another object of the present invention is to provide an improved semiconductor laser output control device using a counter, which is capable of stabilizing the intensity of laser output at high accuracy.

A further object of the present invention is to provide an improved semiconductor laser output control device using a counter, which is capable of preventing the setting of output power of a semiconductor laser in a predetermined time period, to thereby avoid damage to an imaging device on which the laser beam is scanned.

Other objects, advantages and novel features of the present invention will become apparent from the following detailed description of the invention when considered in conjunction with the accompanying drawings.

DESCRIPTION OF THE PREFERRED EMBODIMENTS

Figure 1:
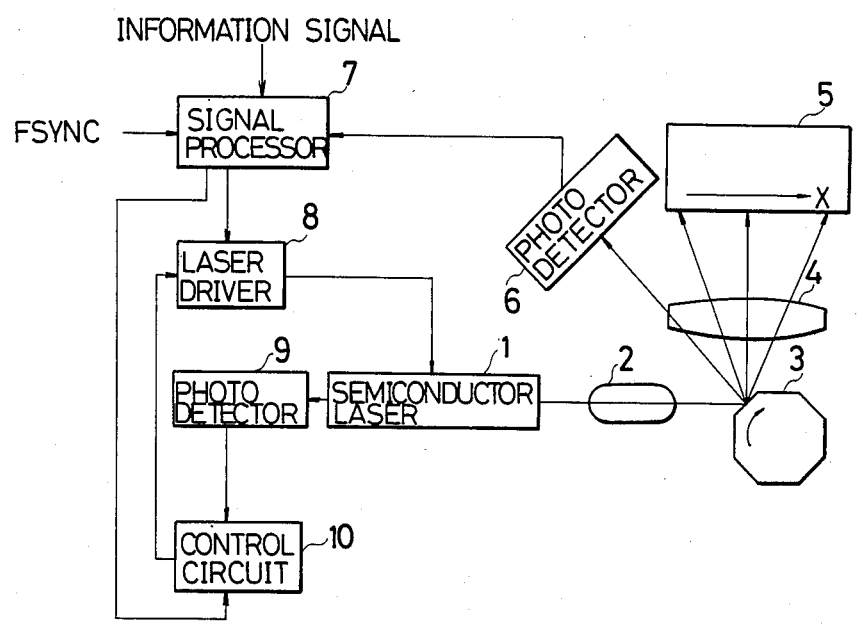
FIG. 1 is a block diagram showing the overall structure of a laser printer to which the present invention has been advantageously applied.

Referring now to FIG. 1, there is schematically shown in block form a laser printer which is constructed in accordance with one embodiment of the present invention. As shown, the laser printer includes a semiconductor laser 1 which emits a laser beam, and the laser beam thus emitted is collimated by a collimating lens 2 and then deflected by a rotating polygonal mirror 3 over a predetermined angle. Then, the deflected laser beam passes through a f$\theta$ lens 4 to be focused onto the imaging surface of a photosensitive drum 5 and scanned thereacross in the widthwise direction as indicated by X. Although not shown specifically, around the drum 5 is arranged various image forming units, such as an uniform charger, developing unit and transferring unit. Thus, the imaging surface of the drum 5 is uniformly charged before being scanned by the laser beam. The drum 5 is set in rotation in a predetermined direction at constant speed and thus the imaging or peripheral surface moves in the circumferential direction, which is often referred to as the auxiliary scanning direction. While the drum 5 is kept in rotation, the polygonal mirror 3 is also driven to rotate at constant speed in the direction indicated by the arrow. As a result, the laser beam is scanned across the drum 5 repetitively in the direction indicated by X, which is often referred to as the main scanning direction, as the polygonal mirror 3 rotates. Since the laser beam is modulated by image information, when the laser beam is scanned across the drum 5 repetitively while maintaining the drum 5 in rotation, the uniform charge on the drum 5 is selectively dissipated so that an electrostatic latent image is formed on the drum 5.

Figure 3:
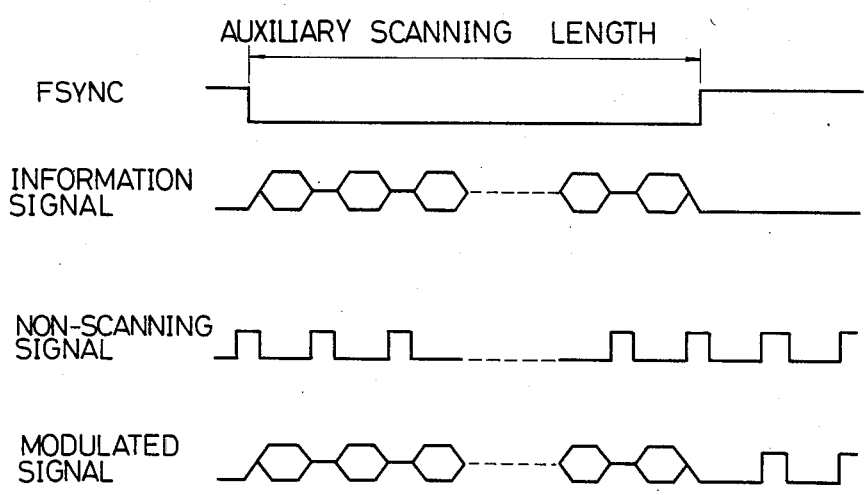
FIGS. 3 and 4 are timing charts which are useful in understanding the operation of the embodiment shown in FIGS. 1 and 2.

A photodetector 6 is disposed so as to receive the laser beam deflected by the polygonal mirror 3 but outside of a predetermined scanning angle for scanning across the drum 5 for imaging purpose. Thus, the photodetector 6 receives the laser beam at the initial stage of each deflecting period by the polygonal mirror 3 and, upon receipt of the laser beam, it supplies as its output a synchronizing signal, which is supplied to a signal processing circuit 7. As shown in timing chart in FIG. 3, the signal processing circuit 7 determines whether it is a scanning time period, in which the photosensitive drum 5 is scanned by the laser beam, or a non-scanning time period, in which the drum 5 is not scanned by the laser beam, according to the singal from the photodetector 6. And, the signal processing circuit 7 carries out the timing control of an information signal supplied thereto from a information signal source (not shown) during a recording mode in which the frame sync signal FSYNC becomes low in level, thereby supplying it as a modulated signal to a semiconductor laser driver 8 during the scanning time period; on the other hand, during the non-scanning time period, it supplies a non-scanning signal to the semiconductor laser driver 8 as a modulated signal.

The laser driver 8 drives the semiconductor laser 1 in accordance with the modulated signal supplied from the signal processing circuit 7, and, thus, a laser beam modulated by the modulated signal is emitted to impinge on the photosensitive drum 5 thereby forming an electrostatic latent image thereon. As mentioned before, this latent image is then developed thereby converting the latent image into a visible toner image, which is then transferred to a sheet of transfer paper. On the other hand, a laser beam emitted rearwardly of the semiconductor laser 1 is incident upon another photodetector 9, where the light intensity of the laser beam is detected, and a detection signal is supplied to a control circuit 10, so that the control circuit 10 controls the operating conditions of the semiconductor laser driver 8 in accordance with this detection signal from the photodetector 9, to keep at a substantially constant level the intensity of the laser beam to be emitted from the semiconductor laser 1.

Figure 2:
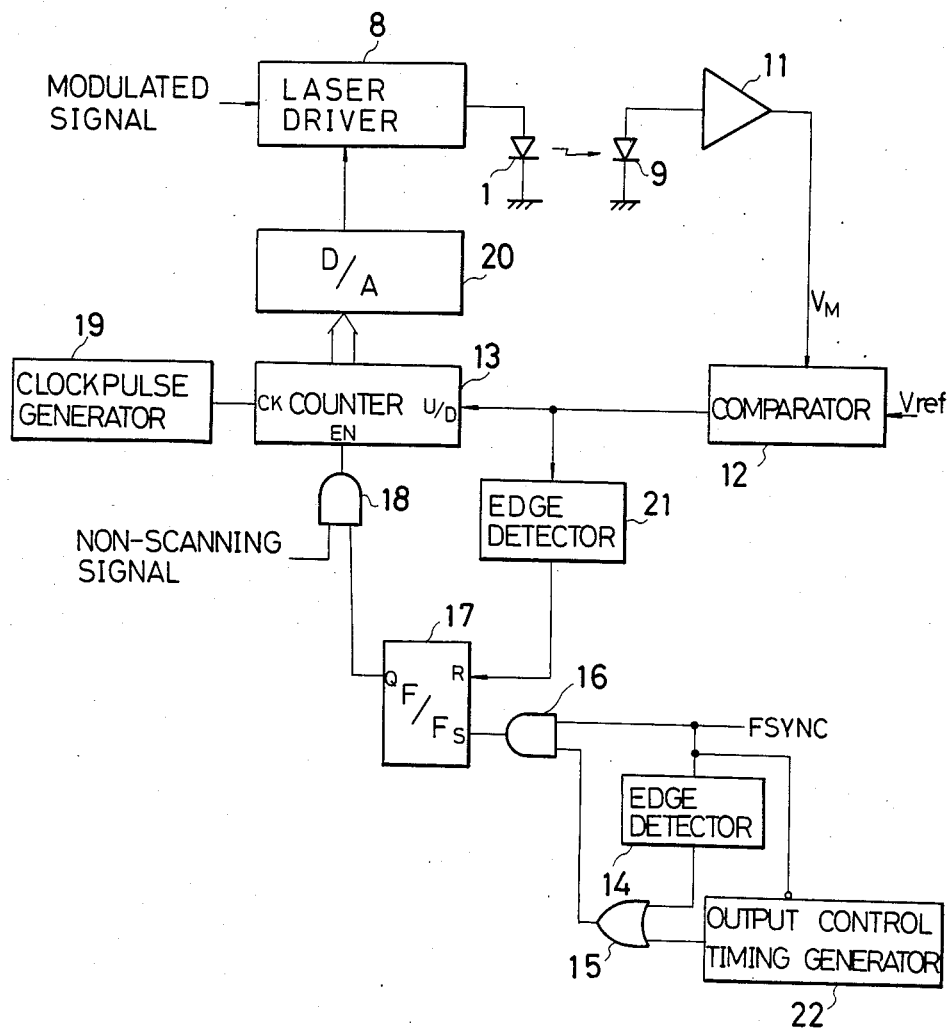
FIG. 2 is a block diagram showing more detail of a part of the structure shown in FIG. 1.
Figure 4:
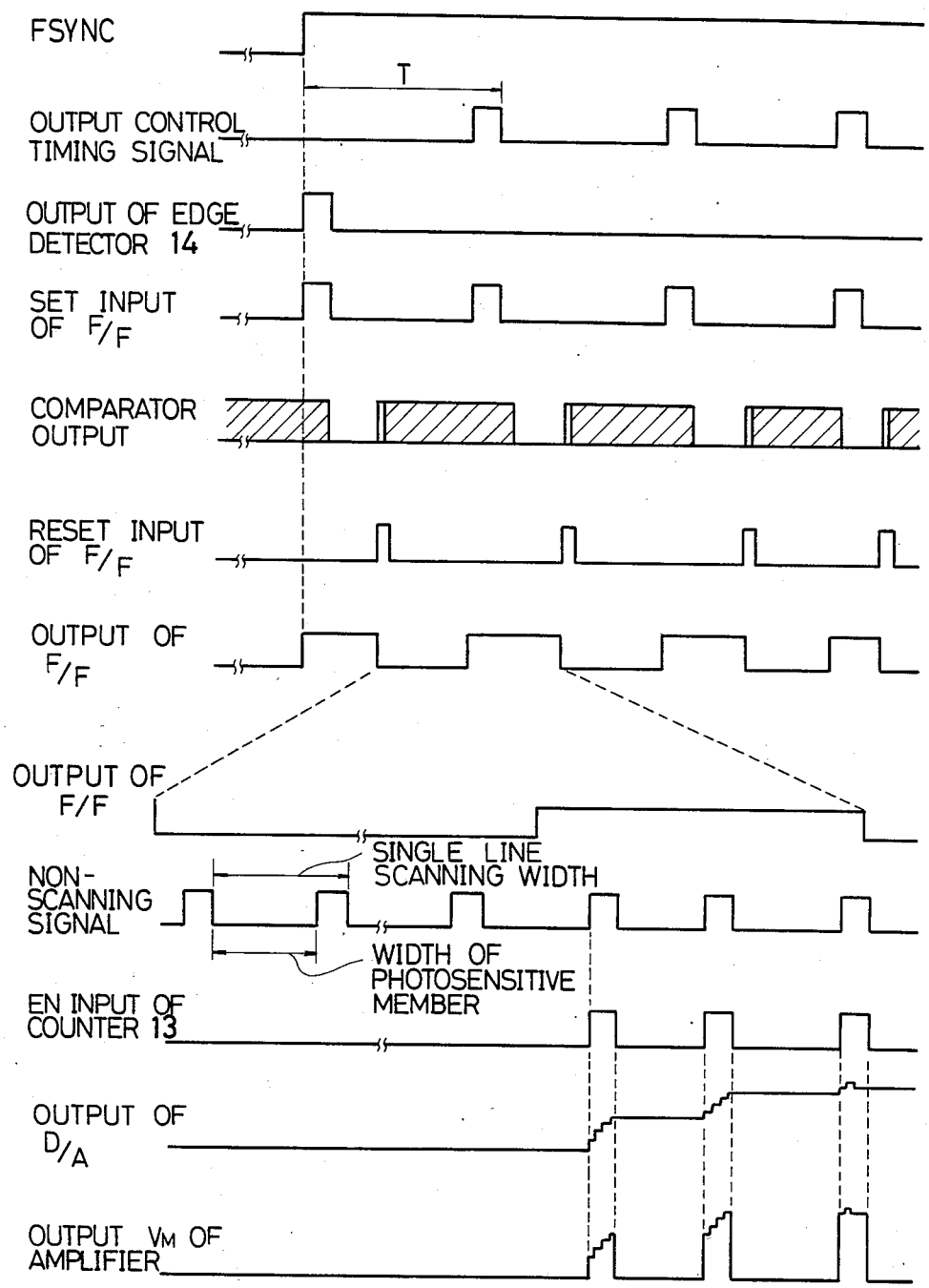

FIG. 2 shows more detail of the structure of the semiconductor laser driver 8 and the control circuit 10 provided in the laser printer shown in FIG. 1, and FIG. 4 is a timing chart which is useful in understanding the operation of the structure shown in FIG. 2. It is to be noted that the shaded areas in the timing chart of FIG. 4 indicate an indeterminate state.

As shown in FIG. 2, the laser beam emitted rearwardly of the semiconductor laser 1 is incident upon the photodetector 9 comprised of a photodiode in the illustrated example, and the photodiode 9 supplies an output current in proportion to the intensity of the laser beam thus received. This current is then converted into a voltage $V_M$ by an amplifier 11, which is then compared with a reference voltage $V_{ref}$ at a comparator 12, which, in turn, supplies as its output either a high level or low level signal depending upon the result of the comparison between the two input voltages $V_M$ and $V_{ref}$, to thereby control the counting mode of an up/down counter 13. For example, if the intensity of the laser beam output from the semiconductor laser 1 is lower than a predetermined value, then the comparator 12 supplies a low level output signal so that the up/down counter 13 is set to operate as an up counter. Also provided is an edge detector 14 which detects the rising edge of the frame sync signal FSYNC and its detection signal is supplied through an OR gate 15 to one input terminal of an AND gate 16 which has its other input terminal connected to receive the frame sync signal FSYNC. When an output signal is supplied from the AND gate 16 to an input terminal S of a flip-flop 17, the flip-flop 17 is set at the beginning of the stand-by mode to produce an output signal, which is then supplied to one input terminal of an AND gate 18 which has its other input terminal connected to receive the non-scanning signal supplied from the signal processing circuit 7. Thus, the up/down counter 13 is released from the disabled state by the output signal supplied from the AND gate 18, and, then, it starts to up-count the clock pulses supplied from the clock pulse generator 19.

A digital count output of this up/down counter 13 is converted into an analog data by a D/A converter 20, which is then supplied to the semiconductor laser driver 8. The semiconductor laser driver 8 drives the semiconductor laser 1 in accordance with a modulated signal supplied from the signal processing circuit 7, and, in this case, its driving current is varied in accordance with the output of the D/A converter 20. Thus, if the count of the up/down counter 13 gradually increases, the intensity of the laser beam emitted from the semiconductor laser 1 gradually increases so that the output voltage $V_M$ of the amplifier 11 increases. During the scanning time period of the photosensitive drum 5, the non-scanning signal is not present so that the AND gate 18 supplies a low level output, which then causes the up/down counter 18 to be disabled, and, thus, the semiconductor laser 1 is not driven during the non-scanning time period of the stand-by state of the semiconductor laser 1; whereas, if the power setting procedure of the semiconductor laser 1 is in progress, its procedure is terminated without completion. On the other hand, upon entering into the non-scanning time period, the power setting procedure of the semiconductor laser 1 is resumed. Thereafter, when the output of the comparator 12 has changed from the low level to the high level, another edge detector 21 detects the rising edge of the output signal of the comparator 12 thereby causing the flip-flop 13 to be reset, so that the up/down counter 13 is again set in the disabled state. Accordingly, the up/down counter 13 holds the current count, and, thus, the magnitude of the driving current to be supplied to the semiconductor laser 1 is maintained at constant.

If the output signal of the comparator 12 is at high level because the intensity of the laser output of the semiconductor laser 1 is relatively high at the time when the disabled state of the up/down counter 13 is released by the output signal of the AND gate 8, then the up/down counter 13 is set to function as a down counter so that the count is decremented according to the clock signal supplied from the clock generator 19. In this case, the output of the D/A converter 16 is decreased thereby decreasing the driving current to be supplied to the semiconductor laser 1, so that the output voltage $V_M$ of the amplifier 11 decreases. Then, when the output voltage $V_M$ of the amplifier 11 has become smaller than the reference voltage $V_{ref}$, and, thus, the output voltage of the comparator 12 has changed from the high level to the low level, the edge detector 21 detects the falling edge of the output signal of the comparator 12 to reset the flip-flop 17, thereby causing the up/down counter 13 to be again disabled. Thus, the up/down counter 13 holds the current count so that the magnitude of the driving current to be supplied to the semiconductor laser 1 is maintained at that level.

Now, if the structure is such that the up/down counter 13 is disabled only when the edge detector 21 has detected the fact that the output voltage of the comparator 12 has changed from the low level to the high level, when the output voltage of the comparator 12 changes from the low level to the high level under the condition that the up/down counter 13 is disabled with the output voltage of the comparator 12 being at the low level, the up/down counter 13 is set in the disabled state, thereby holding the current count. If the output voltage of the comparator 12 changes from the high level to the low level under the condition that the disabled state of the up/down counter 13 is released with the output voltage of the comparator 12 being at the high level, the up/down counter 13 remains released of the disabled state so that it functions as an up counter in response to the output voltage of the comparator 12. The driving current of the semiconductor laser 1 increases, and when the output voltage of the comparator 12 has changed from the low level to the high level, the edge detector 21 detects its rising edge to set the up/down counter 13 in the disabled state, thereby causing it to hold the current count.

Also provided is an output control timing generator 22 which operates in the stand-by mode by the frame sync singal FSYNC and it generates an output control timing signal at a predetermined period T, which is supplied to the OR gate 15, thereby ensuring that the power setting procedure of the semiconductor laser 1 is carried out at a predetermined period.

As described above, in accordance with the present invention, since the output power setting routine is positively prevented from taking place during the scanning time period, in which the laser beam is scanned across the photosensitive drum 5, that the photosensitive drum 5 is prevented from being deteriorated by the power setting routine of the semiconductor laser 1. Besides, the frequency of the clock pulse to be supplied to the counter 13 can be lowered, which, in turn, contributes to manufacturing the present device at reduced cost.

While the above provides a full and complete disclosure of the preferred embodiments of the present invention, various modifications, alternate constructions and equivalents may be employed without departing from the true spirit and scope of the invention. For example, the up/down counter 13 can be arranged to function as a down counter when the output voltage of the comparator 12 is at the low level and as an up counter when the output voltage of the comparator 12 is at the high level, to make the count of the counter inversely proportional to the level of the driving current of the semiconductor laser 1. Therefore, the above description and illustration should not be construed as limiting the scope of the invention, which is defined by the appended claims.

What is claimed is:

1. A device for controlling an output intensity of a laser beam emitted from a semiconductor laser for use in an imaging system in which said laser beam is modulated with; image information and scanned across a photosensitive member, said device comprising:

counting means for counting clock pulses supplied from a clock generator, said counting means being capable of being set, enabled, and disabled selectively;

driving means for driving said semiconductor laser by supplying driving current having a magnitude in accordance with a count of said counting means during a predetermined time period;

detecting means for detecting the output intensity of said laser beam emitted from said semiconductor laser, thereby supplying as its output a detection signal;

comparing means for comparing said detection signal with a predetermined reference signal; and controlling means for controlling said counting means such that said counting means is enabled during said predetermined time period thereby causing said counting means to renew its count until a difference between said detection and reference signals is zero and then said counting means is disabled when said difference has become zero, said controlling means preventing said counting means from being enabled other than said predetermined time period.

2. The device of claim 1 further comprising D/A converting means interposed between said counting means and said driving means, whereby the count of said counting means is supplied to said driving means after having been converted into an equivalent analog data.

3. The device of claim 1 wherein said counting means includes an up/down counter which increments or decrements its count depending on the sign of the difference between said detection and reference signals.

4. The device of claim 1 wherein said predetermined time period is a non-scanning time period in which said laser beam is not scanned across said photosensitive member.

* * * * *